United States Patent
Hida

[11] Patent Number: 6,049,097
[45] Date of Patent: Apr. 11, 2000

[54] RELIABLE HEMT WITH SMALL PARASITIC RESISTANCE

[75] Inventor: Hikaru Hida, Tokyo, Japan

[73] Assignee: NEC Corporation, Tokyo, Japan

[21] Appl. No.: 08/506,363

[22] Filed: Jul. 24, 1995

[30] Foreign Application Priority Data

Jul. 25, 1994 [JP] Japan .................................. 6-192944

[51] Int. Cl.[7] .............................................. H01L 31/328
[52] U.S. Cl. ......................... 257/192; 257/194; 257/201; 257/615
[58] Field of Search .................... 257/192, 194, 257/201, 615

[56] References Cited

U.S. PATENT DOCUMENTS

| | | | |
|---|---|---|---|
| 4,967,242 | 10/1990 | Sonoda et al. | 257/256 |
| 5,250,822 | 10/1993 | Sonoda et al. | 257/194 |
| 5,285,087 | 2/1994 | Narita et al. | 257/194 |
| 5,473,177 | 12/1995 | Nakajima | 257/194 |
| 5,488,237 | 1/1996 | Kuwata | 257/194 |
| 5,521,404 | 5/1996 | Kikkawa et al. | 257/194 |
| 5,677,553 | 10/1997 | Yamamoto et al. | 257/194 |

FOREIGN PATENT DOCUMENTS

| | | |
|---|---|---|
| 63-90173 | 4/1988 | Japan . |
| 1187878 | 7/1989 | Japan . |
| 0315334 | 2/1991 | Japan . |
| 3-104126 | 5/1991 | Japan . |
| 5-343435 | 12/1993 | Japan . |

OTHER PUBLICATIONS

A. Ketterson et al., "High Transconductance In GaAs/AlGaAs Pseudomoriphic Modulation–Doped Field–Effect Transistors," IEEE Electron Device Letters, vol. EDL–6, No. 12, pp. 628–630, Dec. 1985.

*Primary Examiner*—Mark V. Prenty
*Attorney, Agent, or Firm*—Hayes, Soloway, Hennessey, Grossman & Hage PC

[57] ABSTRACT

In an N-channel HEMT, a channel layer having an electron affinity $\chi_1$, a spacer layer having an electron affinity $\chi_2$, and an electron supply layer having an electron affinity $\chi_3$ smaller than the electron affinity $\chi_1$ and larger than the electron affinity $\chi_2$ are laminated in this sequence. Both the channel layer and the electron supply layer include indium (In), and a percentage composition of indium in the channel layer is larger than a percentage composition of indium in the electron supply layer.

33 Claims, 1 Drawing Sheet

RELIABLE HEMT WITH SMALL PARASITIC RESISTANCE

BACKGROUND OF THE INVENTION

1. Field of the Invention

The present invention relates to a field effect type semiconductor device, and more particularly, to a high electron mobility transistor (HEMT).

2. Brief Description of Related Prior Art

Compound semiconductor field effect transistors (FET's) using GaAs have been developed as high frequency elements, and high speed and low power consumption large scale integrated circuits (LSI's). Particularly, in HEMT's, use is made of two-dimensional electron gas formed at a heterojunction interface between an N-type AlGaAs electron supply layer and a GaAs channel layer. That is, such two-dimensional electron gas is used as carriers. In such HEMT's, if the amount of band discontinuity at the heterojunction interface is made large, the density of the two-dimensional electron gas is increased, and also, the threshold value, by which parallel conductance of the electron supply layer is started, is increased, thereby improving performance. Thus, in the prior art, in order to increase the amount of band discontinuity, the percentage composition of aluminum (Al) in the electron supply layer is increased; however, in this case, the parasitic resistance of the electron supply layer is increased particularly when the percentage composition of Al in the electron supply layer is more than 20%. Also, a deep impurity level, which is called a DX center, is created in the electron supply layer. Thus, the reliability of the HEMT's is reduced.

In order to suppress the reduction of the reliability of the HEMT's due to the DX center, there is known a pseudomorphic HEMT in which an electron supply layer is made of GaAs to increase the electron density thereof without creating a DX center, a channel layer is made of InGaAs having a high mobility, and a spacer layer between the electron supply layer and the channel layer is made of AlGaAs (see JP-A HEI1-187878)

In the above-described prior art pseudomorphic HEMT, however, low parasitic resistance, high reliability, and high electron density cannot be effectively achieved.

Also, one prior art HEMT includes an electron supply layer formed by a super lattice configuration of AlGaAs/ $N^+$-type GaAs/AlGaAs (see JP-A-SHO60-7121).

In the above-described prior art HEMT using a super lattice configuration, the configuration is too complex, and also, the properties are too easily changed as a result of heat occurring during operation.

SUMMARY OF THE INVENTION

It is an object of the present invention to provide a HEMT having a low parasitic resistance, a high reliability, and a high charge density.

According to the present invention, in an N-channel HEMT, a channel layer having an electron affinity $\chi_1$, a spacer layer having an electron affinity $\chi_2$, and an electron supply layer having an electron affinity $\chi_3$ smaller than the electron affinity $\chi_1$ and larger than the electron affinity $\chi_2$ are laminated in this sequence. Both the channel layer and the electron supply layer include indium, and a percentage composition of indium in the channel layer is larger than a percentage composition of indium in the electron supply layer.

Also, in a P-channel HEMT, a channel layer having an electron affinity $\chi_1$ and a forbidden energy gap $E_{g1}$, a spacer layer having a sum of a electron affinity $X_2$ and a forbidden energy gap $E_{g2}$ larger than a sum of the electron affinity $\chi_1$ and the forbidden energy gap $E_{g1}$ ($\chi_2+E_{g2}>\chi_1+E_{g1}$), and a hole supply layer having a sum of an electron affinity $\chi_3$ and a forbidden energy gap $E_{g3}$ larger than the sum of the electron affinity $\chi_1$ and the forbidden energy gap $E_{g1}$ and smaller than the sum of the electron affinity $\chi_2$ and the forbidden energy gap $E_{g2}$, are provided. Both the channel layer and the hole supply layer include indium, and a percentage composition of indium in the channel layer is larger than a percentage composition of indium in the hole supply layer. Thus, since indium instead of aluminum is introduced into the channel layer and the electron supply layer (or the hole supply layer), parasitic resistance is reduced, and reliability is improved. Also, since the percentage composition of indium in the channel layer is larger than that in the electron supply layer (or the hole supply layer), a large difference in electron affinity (or the sum of electron affinity and forbidden energy gap) is generated between the channel layer and the electron supply layer (or the hole supply layer), thereby obtaining a high density of charges in the electron supply layer (or the hole supply layer).

BRIEF DESCRIPTION OF THE DRAWINGS

The present invention will be more clearly understood from the description as set forth below, with reference to accompanying drawings, wherein.

DESCRIPTION OF THE PREFERRED EMBODIMENTS

Figure 1:
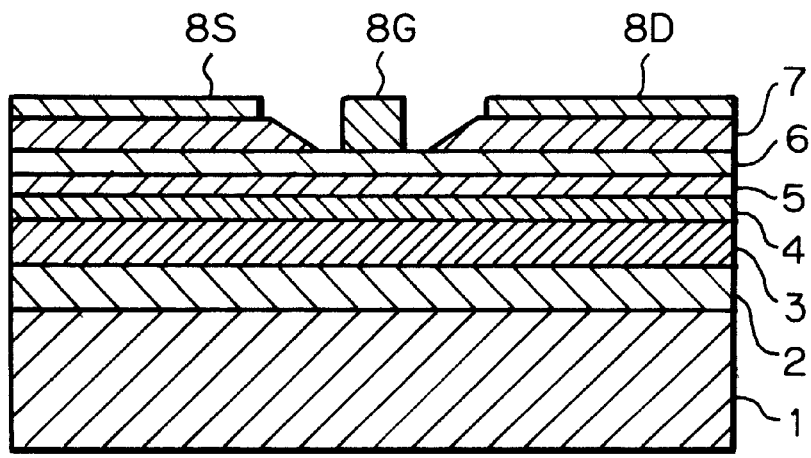
FIG. 1 is a cross-sectional view illustrating a first embodiment of the field effect type semiconductor device according to the present invention.

In FIG. 1, a first embodiment of the present invention is applied to an N-channel HEMT. Grown on a semi-insulating GaAs substrate 1 are an about 500 nm thick undoped GaAs buffer layer 2, an about 10 nm thick undoped $In_{0.35}Ga_{0.65}As$ channel layer 3, an about 2 nm thick undoped GaAs spacer layer 4, an about 5 nm thick N-type $In_{0.15}Ga_{0.85}As$ electron supply layer 5 having a donor density of about $1\times10^{19}/cm^3$, an about 20 nm thick undoped GaAs barrier layer 6, an about 50 nm thick N-type GaAs cap layer 7 having a donor density of about $5\times10^{18}/cm^3$. Also, formed thereon are a gate electrode 8G made of aluminum (Al) and a source electrode 8S and a drain electrode 8D made of AuGe/Ni/Au.

In the N-channel HEMT as illustrated in FIG. 1, since Al, which may increase the parasitic resistance and reduce the reliability due to the DX center, is not included in the layers, the parasitic resistance can be remarkably reduced, and the reliability can be improved. Actually, the parasitic source resistance can be reduced by about ½, as compared with the prior art HEMT including Al in the layers thereof, and also, instability in characteristics is not observed which improves the reliability.

Also, a high density of N-type impurities or donors can be introduced into the electron supply layer 5.

Further, if electron affinities of the channel layer 3, the spacer layer 4, the electron supply layer 5 and the barrier layer 6 are given by $\chi_1, \chi_2, \chi_3$ and $\chi_4$, respectively, since the percentage composition of indium in the channel layer 3 is larger than that in the electron supply layer 5, $\chi_1 > \chi_2$
$\chi_2 < \chi_3 < \chi_1$
$\chi_3 > \chi_4 = \chi_2$ That is, a large difference in electron affinity is generated between the channel layer 3 and the electron supply layer 5. As a result, the surface electron density of the channel layer 3 is increased to improve the current drivability. Also, the electron supply layer 5 can be thin to thereby increase the number of ionized donors thereof. Therefore, even when the total thickness of the channel layer 3, the spacer layer 4 and the electron supply layer 5 beneath the gate electrode 8G is small, a sufficient amount of electrons can be supplied from the electron supply layer 5 to the channel layer 3. Therefore, the channel aspect ratio can be large, and thus even when the gate length is small, a short channel effect can be suppressed. Thus, a high performance N-channel HEMT can be obtained.

Also, since the electron gas layer formed in the channel layer 3 is separated a long way from impurities by the spacer layer 4, high electron mobility is established in the channel layer 3.

Further, since indium is incorporated into the channel layer 3 and the electron supply layer 5, ohmic contact resistances can be formed.

Also, since the barrier layer 6 under the gate electrode 8G is undoped, breakdown voltage is enhanced to thereby suppress deterioration of the barrier layer 6.

Still further, since the channel layer 3 is a strained-layer including indium, a strained-layer can be easily grown for the electron supply layer 5 which is formed on the channel layer 3.

Figure 2:
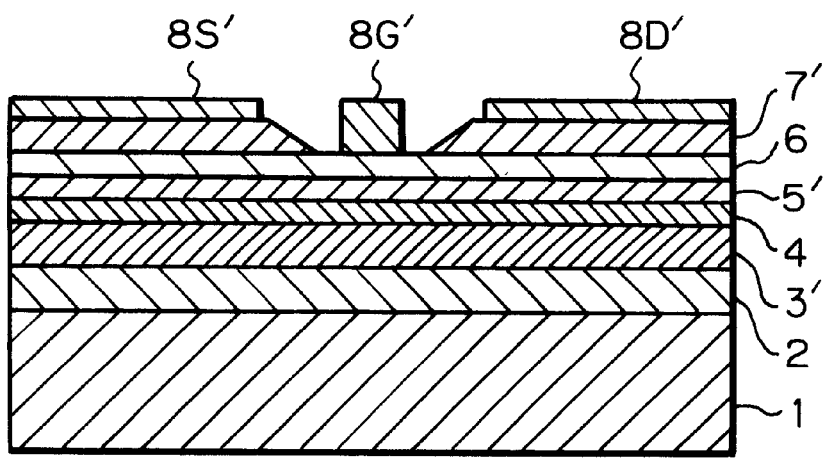
FIG. 2 is a cross-sectional view illustrating a second embodiment of the field effect type semiconductor device according to the present invention.

In FIG. 2, a second embodiment of the present invention is applied to a P-channel HEMT. Grown on a semi-insulating GaAs substrate 1 are an about 500 nm thick undoped GaAs buffer layer 2, an about 10 nm thick undoped $In_{0.5}Ga_{0.5}As$ channel layer 3', an about 2 nm thick undoped GaAs spacer layer 4, an about 5 nm thick P-type $In_{0.15}Ga_{0.85}As$ hole supply layer 5' having an accepter density of about $1 \times 10^{19}/cm^3$, an about 20 nm thick undoped GaAs barrier layer 6, and an about 50 nm thick P-type GaAs cap layer 7' having an accepter density of about $5 \times 10^{18}/cm^3$. Also, formed thereon are a gate electrode 8G' made of WSi and a source electrode 8S' and a drain electrode 8D' made of AuZn.

Also, in the P-channel HEMT as illustrated in FIG. 2, since Al, which may increase parasitic resistance and reduce reliability due to the DX center, is not included in the layers, parasitic resistance can be remarkably reduced, and reliability can be improved. Actually, parasitic source resistance can be reduced by about ½, as compared to the prior art HEMT including Al in the layers thereof, and also, instability in characteristics is not observed which improves reliability. Also, a high density of P-type impurities or accepters can be introduced into the hole supply layer 5'.

Further, if electron affinities of the channel layer 3', the spacer layer 4, the hole supply layer 5' and the barrier layer 6 are given by $\chi_1, \chi_2, \chi_3$ and $\chi_4$, respectively, and forbidden energy gaps of the channel layer 3', the spacer layer 4, the hole supply layer 5' and the barrier layer 6 are given by $E_{g1}$, $E_{g2}$, $E_{g3}$ and $E_{g4}$, respectively, since the percentage composition of indium in the channel layer 3' is larger than that in the hole supply layer 5', $\chi_1 + E_{g1} < \chi_2 + E_{g2}$
$\chi_1 + E_{g1} < \chi_3 + E_{g3} < \chi_2 + E_{g2}$
$\chi_3 + E_{g3} < \chi_4 + E_{g4} = \chi_2 + E_{g2}$ That is, a large difference in sum of electron affinity and forbidden energy gap is generated between the channel layer 3' and the hole supply layer 5'. As a result, the surface hole density of the hole layer 3' is increased so as to improve the current drivability. Also, the hole supply layer 5' can be thin so as to increase the number of ionized accepters thereof. Therefore, even when the total thickness of the channel layer 3', the spacer layer 4 and the hole supply layer 5' beneath the gate electrode 8G' is small, a sufficient amount of holes can be supplied from the hole supply layer 5' to the channel layer 3'. Therefore, the channel aspect ratio can be large, and even when the gate length is small, a short channel effect can be suppressed. Thus, a high performance P-channel HEMT is obtained.

Also, since a hole gas layer formed in the channel layer 3' is separated a long way from impurities by the spacer layer 4, large hole mobility is established in the channel layer 3'.

Further, since indium is incorporated into the channel layer 3' and the electron supply layer 5', ohmic contact resistances can be formed.

Also, since the barrier layer 6 under the gate electrode 8G' is undoped, breakdown voltage is enhanced so as to suppress deterioration of the barrier layer 6.

Still further, since the channel layer 3' is a strained-layer including indium, a strained-layer can be easily grown for the electron supply layer 5' which is formed on the channel layer 3'.

Note that the percentage composition of indium in the channel layer 3 and the electron supply layer 5 can be arbitrary under the condition that the percentage composition of indium in the channel 3 is larger than that in the electron supply layer 5. Similarly, the percentage composition of indium in the channel layer 3' and the hole supply layer 5' can be arbitrary under the condition that the percentage composition of indium in the channel 3' is larger than that in the hole supply layer 5'.

Also, donors (or accepters) can be doped into the electron supply layer 5 (or the hole supply layer 5') by a planar doping method which can dope impurities at an atomic level. In this case, in order to improve the ionization of the donors (or accepters), the thickness of the electron supply layer 5 (the hole supply layer 5') is less than approximately 10 nm, preferably, approximately 3 nm.

Further, the GaAs spacer layer 4 and the GaAs barrier layer 6 can have a donor density (or accepter density) of approximately $10^{10\sim17}/cm^3$, preferably, $5 \times 10^{15}/cm^3$, in order to suppress deterioration of mobility of channel electrons (or channel holes).

Still further, the present invention is applied to other heterojunction semiconductors such as AlInAs/InGaAs.

As explained hereinbefore, according to the present invention, parasitic resistance can be reduced, and also, reliability can be improved. Further, a high density of electrons or holes can be obtained in the electron supply layer or the hole supply layer. Further, breakdown voltage of the control electrode can be increased.

I claim:

1. A field effect type semiconductor device comprising:
    a first semiconductor layer having a first electron affinity $\chi_1$;
    a second semiconductor layer formed on said first semiconductor layer, said second semiconductor being undoped and having a second electron affinity $\chi_2$ smaller than said first electron affinity;
    a third semiconductor layer formed on said second semiconductor layer, said third semiconductor layer having a donor impurity concentration and having a third electron affinity $\chi_3$ smaller than said first electron affinity $\chi_1$ and larger than said second electron affinity $\chi_2$, said first and third semiconductor layers including indium, a percentage composition of indium in said first semiconductor layer being larger than a percentage composition of indium in said third semiconductor layer;

a fourth semiconductor layer formed on said third semiconductor layer, said fourth semiconductor layer being undoped and having a fourth electron affinity $\chi_4$ smaller than said third electron affinity $\chi_3$;

a control electrode formed on said fourth semiconductor layer; and first and second ohmic electrodes formed on said fourth semiconductor layer and sandwiching said control electrode, a voltage at said control electrode changing an amount of charges of an electron channel formed in said first semiconductor layer, to control a current flowing between said first and second electrodes.

2. A device as set forth in claim 1, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

3. A field effect type semiconductor device comprising:

a first semiconductor layer having a first electron affinity $\chi_1$;

a second semiconductor layer formed on said first semiconductor layer, said second semiconductor being undoped and having a second electron affinity $\chi_2$ smaller than said first electron affinity;

a third semiconductor layer formed on said second semiconductor layer, said third semiconductor layer having a donor impurity concentration and having a third electron affinity $\chi_3$ smaller than said first electron affinity $\chi_1$ and larger than said second electron affinity $\chi_2$, said first and third semiconductor layers including indium, a percentage composition of indium in said first semiconductor layer being larger than a percentage composition of indium in said third semiconductor layer;

a fourth semiconductor layer formed on said third semiconductor layer, said fourth semiconductor layer having a donor concentration of approximately $10^{10\sim 17}/cm^3$ and having a fourth electron affinity $\chi_4$ smaller than said third electron affinity $\chi_3$;

a control electrode formed on said fourth semiconductor layer; and first and second ohmic electrodes formed on said fourth semiconductor layer and sandwiching said control electrode, a voltage at said control electrode changing an amount of charges of an electron channel formed in said first semiconductor layer, to control a current flowing between said first and second electrodes.

4. A device as set forth in claim 3, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

5. A field effect type semiconductor device comprising:

a first semiconductor layer having a first electron affinity $\chi_1$;

a second semiconductor layer formed on said first semiconductor layer, said second semiconductor having a donor concentration of approximately $10^{10\sim 17}/cm^3$ and having a second electron affinity $\chi_2$ smaller than said first electron affinity $\chi_1$; and a third semiconductor layer formed on said second semiconductor layer, said third semiconductor layer having a donor impurity concentration and having a third electron affinity $\chi_3$ smaller than said first electron affinity $\chi_1$ and larger than said second electron affinity $\chi_2$, said first and third semiconductor layers including indium, a percentage composition of indium in said first semiconductor layer being larger than a percentage composition of indium in said third semiconductor layer.

6. A device as set forth in claim 5, further comprising:

a fourth semiconductor layer formed on said third semiconductor layer, said fourth semiconductor layer being undoped and having a fourth electron affinity $\chi_4$ smaller than said third electron affinity;

a control electrode formed on said fourth semiconductor layer; and first and second ohmic electrodes formed on said fourth semiconductor layer and sandwiching said control electrode, a voltage at said control electrode changing an amount of charges of an electron channel formed in said first semiconductor layer, to control a current flowing between said first and second electrodes.

7. A device as set forth in claim 6, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

8. A device as set forth in claim 5, further comprising:

a fourth semiconductor layer formed on said third semiconductor layer, said fourth semiconductor layer having a donor concentration of approximately $10^{10\sim 17}/cm^3$ and having a fourth electron affinity $\chi_4$ smaller than said third electron affinity $\chi_3$;

a control electrode formed on said fourth semiconductor layer; and first and second ohmic electrodes formed on said fourth semiconductor layer and sandwiching said control electrode, a voltage at said control electrode changing an amount of charges of an electron channel formed in said first semiconductor layer, to control a current flowing between said first and second electrodes.

9. A device as set forth in claim 8, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

10. A device as set forth in claim 5, wherein the thickness of said third semiconductor layer is less than approximately 10 nm.

11. A field effect type semiconductor device comprising:

a semi-insulating GaAs substrate;

an undoped GaAs buffer layer formed on said substrate;

an $In_yGa_{1-y}As$ channel layer formed on said buffer layer;

an undoped GaAs spacer layer formed on said channel layer;

an N-type In$_z$Ga$_{1-z}$As electron supply layer formed on said spacer layer, wherein the percentage composition y of indium in said channel layer is larger than the percentage composition z of indium in said electron supply layer, and y is a percentage (ratio) composition of In to Ga in In$_y$Ga$_{1-y}$As, and z is a percentage (ratio) composition of In to Ga in In$_z$Ga$_{1-z}$As;

an undoped GaAs barrier layer formed on said electron supply layer;

a gate electrode formed on said barrier layer;

an N-type GaAs cap layer formed on said barrier layer; and a source electrode and a drain electrode formed on said cap layer, a voltage at said gate electrode changing charges of an electron channel formed in said channel layer, to control a current flowing between said source electrode and said drain electrode.

12. A device as set forth in claim 11, further comprising:

a GaAs barrier layer formed on said electron supply layer, said barrier layer having a donor concentration of approximately $10^{10\sim17}$/cm$^3$;

a gate electrode formed on said barrier layer;

an N-type GaAs cap layer formed on said barrier layer; and a source electrode and a drain electrode formed on said cap layer, a voltage at said gate electrode changing charges of an electron channel formed in said channel layer, to control a current flowing between said source electrode and said drain electrode.

13. A field effect type semiconductor device comprising:

a semi-insulating GaAs substrate;

an undoped GaAs buffer layer formed on said substrate;

an In$_y$Ga$_{1-y}$As channel layer formed on said buffer layer;

a GaAs spacer layer formed on said channel layer and having a donor concentration of approximately $10^{10\sim7}$/cm$^3$; and an N-type In$_z$Ga$_{1-z}$As electron supply layer formed on said spacer layer, wherein the percentage composition y of indium in said channel layer is larger than the percentage composition z of indium in said electron supply layer, and y is a percentage (ratio) composition of In to Ga in In$_y$Ga$_{1-y}$As and z is a percentage (ratio) composition of In to Ga in In$_z$Ga$_{1-z}$As.

14. A device as set forth in claim 13, further comprising:

an undoped GaAs barrier layer formed on said electron supply layer;

a gate electrode formed on said barrier layer;

an N-type GaAs cap layer formed on said barrier layer; and a source electrode and a drain electrode formed on said cap layer, a voltage at said gate electrode changing charges of an electron channel formed in said channel layer, to control a current flowing between said source electrode and said drain electrode.

15. A device as set forth in claim 13, further comprising:

a GaAs barrier layer formed on said electron supply layer, said barrier layer having a donor concentration of approximately $10^{10\sim17}$/cm$^3$;

a gate electrode formed on said barrier layer;

an N-type GaAs cap layer formed on said barrier layer; and a source electrode and a drain electrode formed on said cap layer, a voltage at said gate electrode changing charges of an electron channel formed in said channel layer, to control a current flowing between said source electrode and said drain electrode.

16. A field effect type semiconductor device comprising:

a first semiconductor layer having a first electron affinity $\chi_1$ and a first forbidden energy gap $E_{g1}$;

a second semiconductor layer formed on said first semiconductor layer, said second semiconductor being undoped and having a sum of a second electron affinity $\chi_2$ and a second forbidden energy gap $E_{g2}$ larger than a sum of said first electron affinity $\chi_1$ and said first forbidden energy gap $E_{g1}$; and a third semiconductor layer formed on said second semiconductor layer, said third semiconductor layer having an accepter impurity concentration and having a sum of a third electron affinity $X_3$ and a third forbidden energy gap $E_{g3}$ larger than a sum of said first electron affinity $\chi_1$ and said first forbidden energy gap $E_{g1}$ and smaller than a sum of said second electron affinity $\chi_2$ and said second forbidden energy gap $E_{g2}$, said first and third semiconductor including indium, a percentage composition of indium in said first semiconductor layer being larger than a percentage composition of indium in said third semiconductor layer.

17. A device as set forth in claim 16, further comprising:

a fourth semiconductor layer formed on said third semiconductor layer, said fourth semiconductor layer being undoped and having a sum of a fourth electron affinity $\chi_4$ and a fourth forbidden energy gap $E_{g4}$ larger than a sum of said third electron affinity and said third forbidden energy gap $E_{h3}$;

a control electrode formed on said fourth semiconductor layer; and first and second ohmic electrodes formed on said fourth semiconductor layer and sandwiching said control electrode, a voltage at said control electrode changing an amount of charges of hole channel formed in said first semiconductor layer, to control a current flowing between said first and second electrodes.

18. A device as set forth in claim 17, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

19. A device as set forth in claim 16, further comprising:

a fourth semiconductor layer formed on said third semiconductor layer, said fourth semiconductor layer having an impurity concentration of approximately $10^{10\sim17}$/cm$^3$ and having a sum of a fourth electron affinity $\chi_4$ and a fourth forbidden energy gap $E_{g4}$ larger than a sum of said third electron affinity $\chi_3$ and said third forbidden energy gap $E_{g3}$;

a control electrode formed on said fourth semiconductor layer; and first and second ohmic electrodes formed on said fourth semiconductor layer and sandwiching said control electrode, a voltage at said control electrode changing an amount of charges of a hole channel formed in said first semiconductor layer, to control a current flowing between said first and second electrodes.

20. A device as set forth in claim 19, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

21. A device as set forth in claim 16, wherein the thickness of said third semiconductor layer is less than approximately 10 nm.

22. A field effect type semiconductor device comprising:
a first semiconductor layer having a first electron affinity $\chi_1$ and a first forbidden enery gap $E_{g1}$;
a second semiconductor layer formed on said first semiconductor layer, said second semiconductor having a accepter concentration of approximately $10^{10~17}/cm^3$ and having a sum of a second electron affinity $\chi_2$ and a second forbidden energy gap $E_{g2}$ larger than a sum of said first electron affinity $\chi_1$ and said first forbidden energy gap $E_{g1}$; and
a third semiconductor layer formed on said second semiconductor layer, said third semiconductor layer having an accepter impurity concentration and having a sum of a third electron affinity $\chi_3$ and a third forbidden energy gap $E_{g3}$ larger than a sum of said first electron affinity $\chi_1$ and said first forbidden energy gap $E_{g1}$ and smaller than a sum of said second electron affinity and $\chi_2$ said second forbidden energy gap $E_{g2}$,
said first and third semiconductor including indium, a percentage composition of indium in said first semiconductor layer being larger than a percentage composition of indium in said third semiconductor layer.

23. A device as set forth in claim 22, further comprising:
a fourth semiconductor layer formed on said third semiconductor layer, said fourth semiconductor layer being undoped and having a sum of a fourth electron affinity $\chi_4$ and a fourth forbidden energy gap $E_{g4}$ larger than a sum of said third electron affinity $\chi_3$ and said third forbidden energy gap $E_{g3}$;
a control electrode formed on said fourth semiconductor layer; and
first and second ohmic electrodes formed on said fourth semiconductor layer and sandwiching said control electrode,
a voltage at said control electrode changing an amount of charges of a hole channel formed in said first semiconductor layer, to control a current flowing between said first and second electrodes.

24. A device as set forth in claim 23, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

25. A device as set forth in claim 22, further comprising:
a fourth semiconductor layer formed on said third semiconductor layer, said fourth semiconductor layer having an accepter concentration of approximately $10^{10~17}/cm^3$ and having a sum of a fourth electron affinity $\chi_4$ and a fourth forbidden energy gap $E_{g4}$ larger than a sum of said third electron affinity $\chi_3$ and said third forbidden energy gap $E_{g3}$;
a control electrode formed on said fourth semiconductor layer; and
first and second ohmic electrodes formed on said fourth semiconductor layer and sandwiching said control electrode,
a voltage at said control electrode changing an amount of charges of a hole channel formed in said first semiconductor layer, to control a current flowing between said first and second electrodes.

26. A device as set forth in claim 25, wherein said first semiconductor layer is lattice mismatched to said second semiconductor layer, said second semiconductor layer being lattice mismatched to said third semiconductor layer, said third semiconductor layer being lattice mismatched to said fourth semiconductor layer.

27. A device as set forth in claim 22, wherein the thickness of said third semiconductor layer is less than approximately 10 nm.

28. A field effect type semiconductor device comprising:
a semi-insulating GaAs substrate;
an undoped GaAs buffer layer formed on said substrate;
an $In_yGa_{1-y}As$ channel layer formed on said buffer layer;
an undoped GaAs spacer layer formed on said channel layer; and
a P-type $In_zGa_{1-z}As$ hole supply layer formed on said spacer layer,
wherein the percentage composition y of indium in said channel layer is larger than the percentage composition z of indium in said hole supply layer, and y is a percentage (ratio) composition of In to Ga in $In_yGa_{1-y}As$, and z is a percentage (ratio) composition of In to Ga in $In_zGa_{1-z}As$.

29. A device as set forth in claim 28, further comprising:
an undoped GaAs barrier layer formed on said hole supply layer;
a gate electrode formed on said barrier layer;
a P-type GaAs cap layer formed on said barrier layer; and
a source electrode and a drain electrode formed on said cap layer,
a voltage at said gate electrode changing charges of a hole channel formed in said channel layer, to control a current flowing between said source electrode and said drain electrode.

30. A device as set forth in claim 28, further comprising:
a GaAs barrier layer formed on said hole supply layer, said barrier layer having an accepter concentration of approximately $10^{10~17}/cm^3$;
a gate electrode formed on said barrier layer;
a P-type GaAs cap layer formed on said barrier layer; and
a source electrode and a drain electrode formed on said cap layer,
a voltage at said gate electrode changing charges of a hole channel formed in said channel layer, to control a current flowing between said source electrode and said drain electrode.

31. A field effect type semiconductor device comprising:
a semi-insulating GaAs substrate;
an undoped GaAs buffer layer formed on said substrate;
an $In_yGa_{1-y}As$ channel layer formed on said buffer layer;
a GaAs spacer layer formed on said channel layer and having an accepter concentration of approximately $10^{10~7}/cm^3$; and
a P-type $In_zGa_{1-z}As$ hole supply layer formed on said spacer layer,
wherein the percentage composition y of indium in said channel layer is larger than the percentage composition z of indium in said hole supply layer, and y is a percentage (ratio) composition of In to Ga in $In_yGa_{1-y}As$, and z is a percentage (ratio) composition of In to Ga in $In_zG_{1-z}As$.

32. A device as set forth in claim 34, further comprising:
an undoped GaAs barrier layer formed on said hole supply layer;
a gate electrode formed on said barrier layer;
a P-type GaAs cap layer formed on said barrier layer; and
a source electrode and a drain electrode formed on said cap layer,
a voltage at said gate electrode changing charges of a hole channel formed in said channel layer, to control a current flowing between said source electrode and said drain electrode.

33. A device as set forth in claim 31, further comprising:
a GaAs barrier layer formed on said hole supply layer, said barrier layer having an accepter concentration of approximately $10^{10\sim17}/cm^3$;
a gate electrode formed on said barrier layer;
a P-type GaAs cap layer formed on said barrier layer; and
a source electrode and a drain electrode formed on said cap layer,
a voltage at said gate electrode changing charges of a hole channel formed in said channel layer, to control a current flowing between said source electrode and said drain electrode.

* * * * *